US012652050B2

(12) United States Patent
Tang et al.

(10) Patent No.: US 12,652,050 B2
(45) Date of Patent: Jun. 9, 2026

(54) LOGIC CIRCUIT

(71) Applicant: Vanguard International Semiconductor Corporation, Hsinchu (TW)

(72) Inventors: Po-Yuan Tang, Hsinchu City (TW); Yang-Sen Yeh, Baoshan Township (TW); Yu-Chuan Chang, Hsinchu City (TW); Hsuan-Chi Su, Qionglin Township (TW); Chung-Wei Tsai, Zhubei City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 49 days.

(21) Appl. No.: 18/809,808

(22) Filed: Aug. 20, 2024

(65) Prior Publication Data

US 2026/0058661 A1     Feb. 26, 2026

(51) Int. Cl.
H03K 19/094 (2006.01)

(52) U.S. Cl.
CPC ................................... H03K 19/094 (2013.01)

(58) Field of Classification Search
CPC ...................................................... H03K 19/094
USPC ............................. 326/87, 102, 83; 327/534
See application file for complete search history.

(56) References Cited

U.S. PATENT DOCUMENTS 5,831,451 A      11/1998  Bosshart
6,351,158 B1 *   2/2002  Shearon ........... H03K 19/00315
                                                                327/108

FOREIGN PATENT DOCUMENTS

EP        2 107 680 B1    1/2012
TW        1774083 B       8/2022

OTHER PUBLICATIONS

Taiwanese Office Action and Search Report for Taiwanese Application No. 113121965, dated Feb. 7, 2025.

* cited by examiner

*Primary Examiner* — Arnold M Kinkead
(74) *Attorney, Agent, or Firm* — Birch, Stewart, Kolasch & Birch, LLP

(57)     ABSTRACT

A logic circuit including a first PMOS transistor, a second PMOS transistor, and an NMOS transistor is provided. The first PMOS transistor is coupled to an input-output pad. The second PMOS transistor is coupled to the first PMOS transistor in series between the input-output pad and an output terminal and receives a first input signal. The NMOS transistor is coupled to the second PMOS transistor. The voltage of the bulk of the first PMOS transistor is a first floating level. The voltage of the bulk of the second PMOS transistor is a second floating level.

16 Claims, 5 Drawing Sheets

LOGIC CIRCUIT

BACKGROUND OF THE INVENTION

Field of the Invention

The present invention relates to a logic circuit, and, in particular, to a logic circuit that provides PMOS transistors.

Description of the Related Art

In a general logic circuit, the bulk of a PMOS transistor is usually coupled to an operating voltage. When the PMOS transistor is turned off, if the operating voltage is higher than the breakdown voltage of the PMOS transistor, the PMOS transistor may conduct slightly, thus causing leakage current to pass through the PMOS transistor.

BRIEF SUMMARY OF THE INVENTION

In accordance with an embodiment of the disclosure, a logic circuit comprises a first PMOS transistor, a second PMOS transistor, and an NMOS transistor. The first PMOS transistor is coupled to an input-output pad. The second PMOS transistor is coupled to the first PMOS transistor in series between the input-output pad and an output terminal and receives a first input signal. The NMOS transistor is coupled to the second PMOS transistor. The voltage of the bulk of the first PMOS transistor is a first floating level. The voltage of the bulk of the second PMOS transistor is a second floating level.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
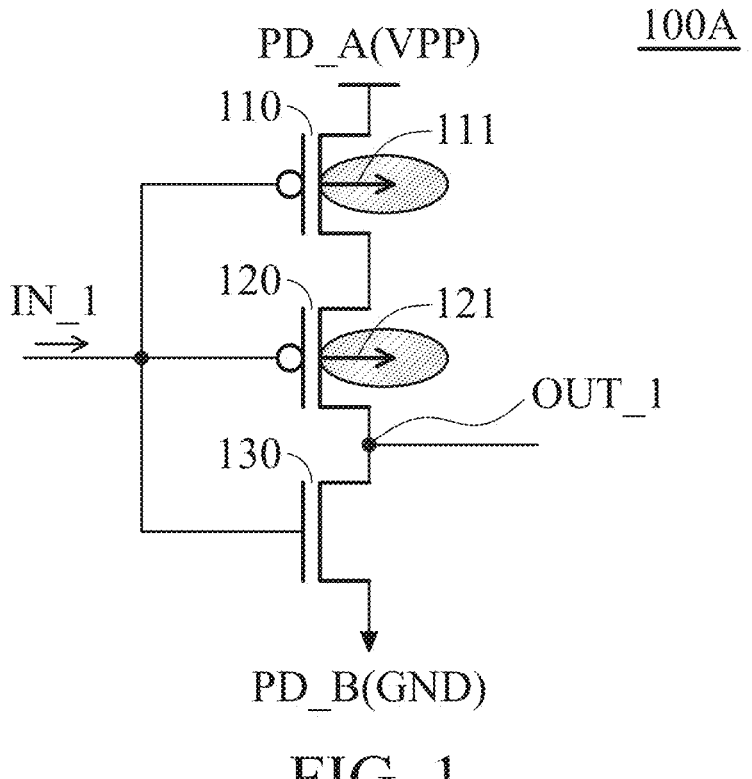
FIG. 1 is a schematic diagram of an exemplary embodiment of a logic circuit according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a logic circuit according to various aspects of the present disclosure. The logic circuit 100A comprises PMOS transistors 110 and 120, and an NMOS transistor 130. The PMOS transistor 110 is connected to the PMOS transistor 120 in series between an input-output pad PD_A and an output terminal OUT_1. In this embodiment, the source of the PMOS transistor 110 is coupled to the input-output pad PD_A, and the gate of the PMOS transistor 110 receives an input signal IN_1. The source of the PMOS transistor 120 is coupled to the drain of the PMOS transistor 110. The gate of the PMOS transistor 120 receives the input signal IN_1. The drain of the PMOS transistor 120 is coupled to the output terminal OUT_1.

The NMOS transistor 130 is coupled to the PMOS transistor 120. In this embodiment, the drain of the NMOS transistor 130 is coupled to the output terminal OUT_1, the source of the NMOS transistor 130 is coupled to an input-output pad PD_B, and the gate of the NMOS transistor 130 receives the input signal IN_1. In one embodiment, the input-output pad PD_A is configured to receive an operating voltage VPP. The input-output pad PD_B is configured to receive an operating voltage GND. In this case, the operating voltage VPP is higher than the operating voltage GND. For example, the operating voltage GND is a ground voltage.

In this embodiment, the bulk 111 of the PMOS transistor 110 is electrically isolated from the bulk 121 of the PMOS transistor 120. In other words, the bulks 111 and 121 are separated and insulated from each other. In one embodiment, the voltage level of the bulk 111 is a first floating level and the voltage level of the bulk 131 is a second floating level. In this case, the first floating level may be different from the second floating level. In other embodiments, the bulk 111 may be coupled to the input-output pad PD_A. In this case, the voltage of the bulk 111 is equal to the operating voltage VPP.

In some embodiments, the bulk 111 may be an electrical contact of a first N-type well, and the bulk 121 may be an electrical contact of a second N-type well. The first N-type well is electrically isolated from the second N-type well. In this case, no voltage is provided to the bulks 111 and 121 so that the voltage levels of the bulks 111 and 121 are floating levels.

For brevity, assume that the voltage levels of the bulks 111 and 121 are floating levels, and the operating voltage VPP is 10.6V. Assume that the voltage of the PN junction between the source and the bulk of a PMOS transistor is about 0.8V, and the breakdown voltage between the bulk and the drain of the PMOS transistor is about 8.2V.

When the input signal IN_1 is at a first level (e.g., 10.6V), since the voltage of the gate of the PMOS transistor 110 is equal to the voltage of the source of the PMOS transistor 110, the PMOS transistor 110 is turned off. At this time, the voltage of the bulk 111 is approximately equal to 9.8V, which is the operating voltage VPP (10.6V) minus the voltage (0.8V) of the PN junction between the source and the bulk 111 of the PMOS transistor 110. The voltage of the source of the PMOS transistor 120 is approximately equal to 1.6V, which is the voltage (9.8V) of the bulk 111 minus the breakdown voltage (8.2V) between the bulk 111 and the drain of the PMOS transistor 110. The voltage of the bulk 121 is approximately equal to 0.8V, which is the voltage (1.6V) of the source of the PMOS transistor 120 minus the voltage (0.8V) of the PN junction between the source and the bulk of the PMOS transistor 120. Since the voltage difference between the bulk and the drain of the PMOS transistor 120 is less than the breakdown voltage (8.2V) of the PMOS transistor 120, a breakdown event does not occur in PMOS transistor 120. Additionally, since the gate voltage (10.6V) of the PMOS transistor 120 is higher than the source voltage (1.6V) of the PMOS transistor 120, it is ensured that the PMOS transistor 120 is turned off. Since the gate voltage (10.6V) of the NMOS transistor 130 is higher than the source voltage (0V) of the NMOS transistor 130, the NMOS transistor 130 is turned on so that the voltage of the output terminal OUT_1 is approximately equal to the operating voltage GND, such as 0V.

When the input signal IN_1 is at a second level (e.g., 0V), the NMOS transistor 130 is turned off and the PMOS transistor 110 is turned on. At this time, the voltage of the bulk 111 is approximately equal to 9.8V, which is the operating voltage VPP (10.6V) minus the voltage (0.8V) of the PN junction between the source and the bulk 111 of the PMOS transistor 110. Since the PMOS transistor 110 is turned on, the source voltage of the PMOS transistor 120 is approximately equal to 10.6V. Since the source voltage of the PMOS transistor 120 is higher than the gate voltage of the PMOS transistor 120, the PMOS transistor 120 is turned on. At this time, the voltage of the bulk 121 is approximately equal to 9.8V, which is the source voltage (10.6V) of the PMOS transistor 120 minus the voltage (0.8V) of the PN junction between the source and the bulk of the PMOS transistor 120. Since the PMOS transistors 110 and 120 are turned on, the voltage of the output terminal OUT_1 is approximately equal to the operating voltage VPP, such as 10.6V.

In this embodiment, the voltage level of the output terminal OUT_1 is the opposite of the voltage level of the input signal IN_1. For example, when the voltage level of the input signal IN_1 at a high level (e.g., 10.6V), the voltage level of the output terminal OUT_1 is approximately equal to the voltage (e.g., 0V) of the input-output pad PD_B. When the voltage level of the input signal IN_1 at a low level (e.g., 0V), the voltage level of the output terminal OUT_1 is approximately equal to the voltage (e.g., the operating voltage VPP) of the input-output pad PD_A. Therefore, the logic circuit 100A can serve as an inverter.

Figure 2A:
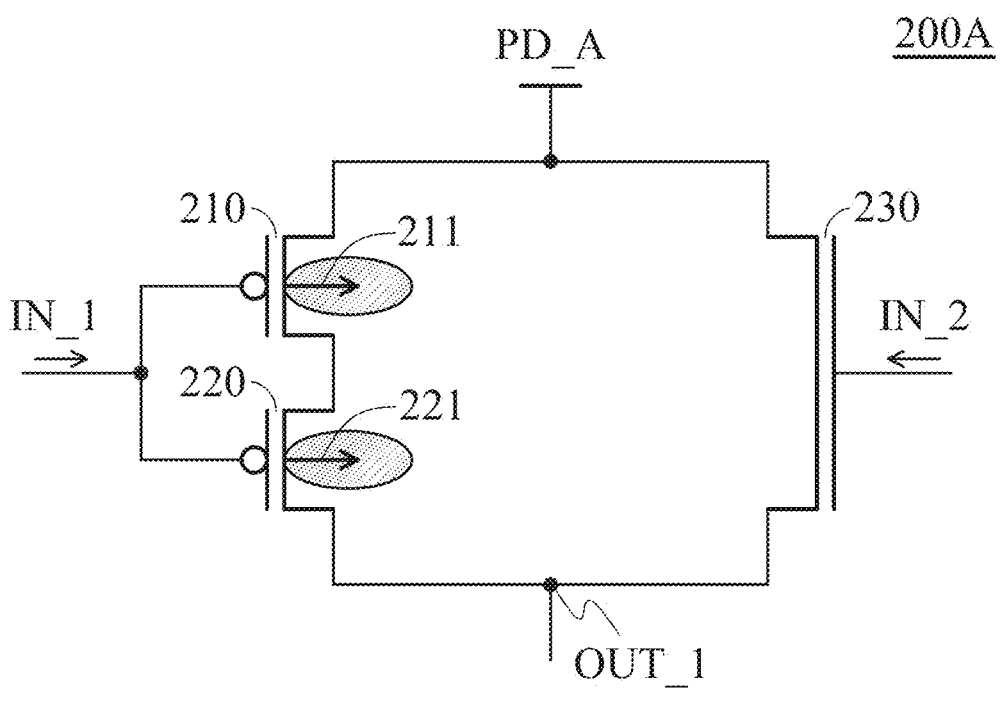
FIG. 2A is a schematic diagram of another exemplary embodiment of the logic circuit according to various aspects of the present disclosure.

FIG. 2A is a schematic diagram of another exemplary embodiment of the logic circuit according to various aspects of the present disclosure. The logic circuit 200A comprises PMOS transistors 210 and 220 and an NMOS transistor 230. The PMOS transistor 210 is connected to the PMOS transistor 220 in series between the input-output pad PD_A and the output terminal OUT_1. In this embodiment, the source of the PMOS transistor 210 is coupled to the input-output pad PD_A, and the gate of the PMOS transistor 210 receives the input signal IN_1. The source of the PMOS transistor 220 is coupled to the drain of the PMOS transistor 210. The gate of the PMOS transistor 220 receives the input signal IN_1. The drain of the PMOS transistor 220 is coupled to the output terminal OUT_1.

The NMOS transistor 230 is coupled between the input-output pad PD_A and the output terminal OUT_1. In this embodiment, the NMOS transistor 230 is coupled to the PMOS transistors 210 and 220 in parallel. As shown in FIG. 2A, the drain of the NMOS transistor 230 is coupled to the input-output pad PD_A. The source of the NMOS transistor 230 is coupled to the output terminal OUT_1. The gate of the NMOS transistor 230 receives the input signal IN_2.

In one embodiment, the level of the input signal IN_1 is the opposite of the level of the input signal IN_2. For example, when the input signal IN_1 is at a high level (e.g., 10.6V), the input signal IN_2 is at a low level (e.g., 0V). When the input signal IN_1 is at a low level (e.g., 0V), the input signal IN_2 is at a high level (e.g., 10.6V).

In this embodiment, the bulk 211 of the PMOS transistor 210 is electrically isolated from the bulk 221 of the PMOS transistor 220. In one embodiment, the voltage levels of the bulks 211 and 221 are floating levels, but the disclosure is not limited thereto. In other embodiments, the bulk 211 may be coupled to the input-output pad PD_A.

For brevity, assume that the voltage levels of the bulks 211 and 221 are floating levels, and the voltage of the input-output pad PD_A is equal to 10.6V. Assume that the voltage of the PN junction between the source and the bulk of a PMOS transistor is about 0.8V, and the breakdown voltage between the bulk and the drain of the PMOS transistor is about 8.2V.

When the input signal IN_1 is at a first level (e.g., 10.6V) and the input signal IN_2 is at a second level (e.g., 0V), since the gate voltage of the PMOS transistor 210 is equal to the source voltage of the PMOS transistor 210, the PMOS transistor 210 is turned off. At this time, the voltage of the bulk 211 is approximately equal to 9.8V, which is the voltage (10.6V) of the input-output pad PD_A minus the voltage (0.8V) of the PN junction between the source and the bulk 211 of the PMOS transistor 210. At this time, the source voltage of the PMOS transistor 220 is approximately equal to 1.6V, which is the voltage (9.8V) of the bulk 211 minus the breakdown voltage (8.2V) of the PMOS transistor 210. The voltage of the bulk 221 is approximately equal to 0.8V, which is the source voltage (1.6V) of the PMOS transistor 220 minus the voltage (0.8V) of the PN junction between the source and the bulk of the PMOS transistor 220. Since the gate voltage (10.6V) of the PMOS transistor 220 is higher than the source voltage (1.6V) of the PMOS transistor 220, it is ensured that the PMOS transistor 220 is turned off. At this time, since the gate voltage (0V) of the NMOS transistor 230 is at the second level, the NMOS transistor 230 is turned off.

When the input signal IN_1 is at a second level (e.g., 0V) and the input signal IN_2 is at a first level (e.g., 10.6V), the PMOS transistor 210 is turned on. At this time, the voltage of the bulk 211 is approximately equal to 9.8V, which is the voltage (10.6V) of the input-output pad PD_A minus the voltage (0.8V) of the PN junction between the source and the bulk 211 of the PMOS transistor 210. Since the PMOS transistor 210 is turned on, the source voltage of the PMOS transistor 220 is approximately equal to the voltage (10.6V) of the input-output pad PD_A. At this time, since the gate voltage of the PMOS transistor 220 is approximately equal to 0V, the PMOS transistor 220 is turned on. At this time, the voltage of the bulk 221 is approximately equal to 9.8V, which is the source voltage (10.6V) of the PMOS transistor 220 minus the voltage (0.8V) of the PN junction between the source and the bulk of the PMOS transistor 220. Since the gate voltage of the NMOS transistor 230 is at the first level (e.g., 10.6V), the NMOS transistor 230 is turned on. Since the PMOS transistors 210 and 220, and NMOS transistor 230 are turned on, the voltage of the output terminal OUT_1 is approximately equal to the voltage (e.g., 10.6V) of the input-output pad PD_A.

In this embodiment, when the PMOS transistors 210 and 220, and the NMOS transistor 230 are turned off, the PMOS transistors 210 and 220, and the NMOS transistor 230 do not transmit the voltage of the input-output pad PD_A to the output terminal OUT_1. When the PMOS transistors 210 and 220, and the NMOS transistor 230 are turned on, the PMOS transistors 210 and 220, and the NMOS transistor 230 transmit the voltage of the input-output pad PD_A to the output terminal OUT_1. Therefore, the logic circuit 200A can serve as a pass-gate or a transmission gate.

Figure 2B:
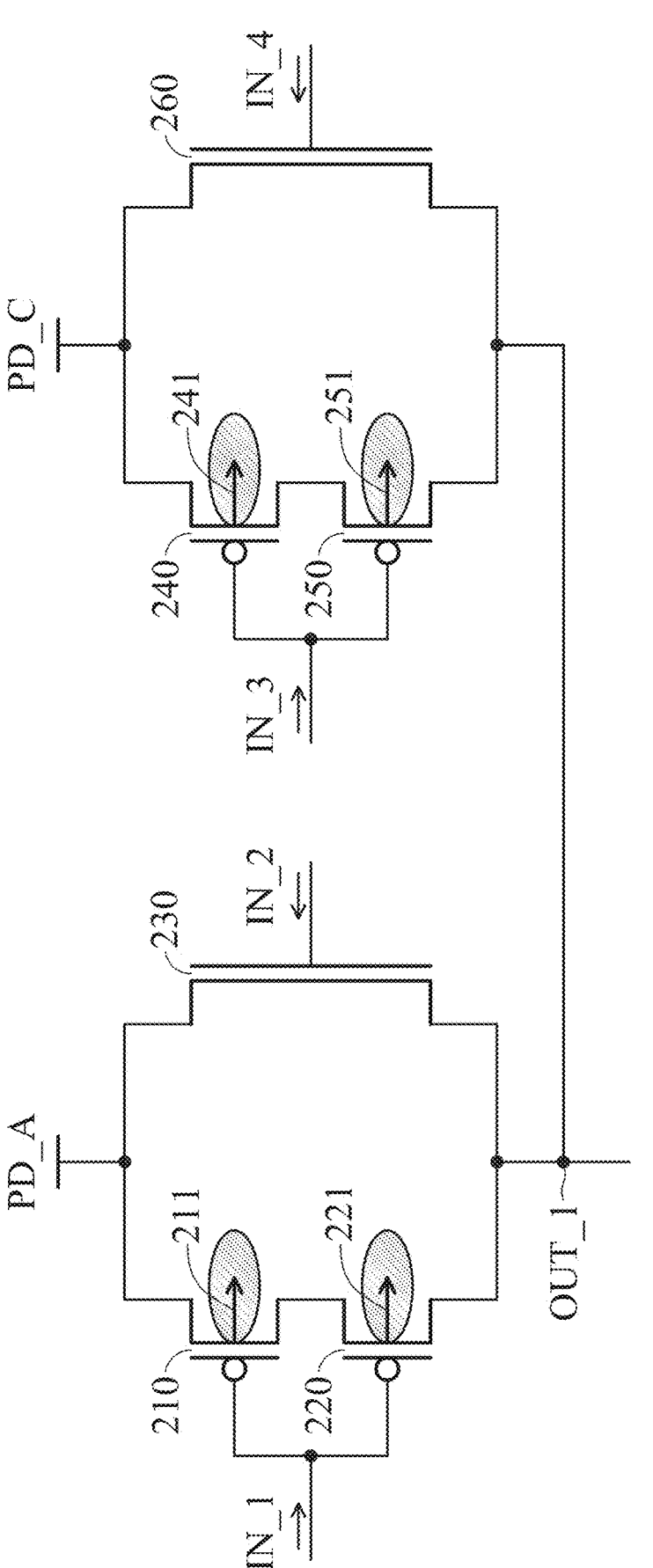
FIG. 2B is a schematic diagram of another exemplary embodiment of the logic circuit according to various aspects of the present disclosure.

FIG. 2B is a schematic diagram of another exemplary embodiment of the logic circuit according to various aspects of the present disclosure. FIG. 2B is similar to FIG. 2A except for the addition of the PMOS transistors 240 and 250, and an NMOS transistor 260. The PMOS transistor 240 is connected to the PMOS transistor 250 in series between an input-output pad PD_C and the output terminal OUT_1. In this embodiment, the source of the PMOS transistor 240 is coupled to the input-output pad PD_C, and the gate of the PMOS transistor 240 receives an input signal IN_3. The source of the PMOS transistor 250 is coupled to the drain of the PMOS transistor 240. The gate of the PMOS transistor 250 receives the input signal IN_3. The drain of the PMOS transistor 250 is coupled to the output terminal OUT_1.

The NMOS transistor 260 is coupled between the input-output pad PD_C and the output terminal OUT_1. In this embodiment, the NMOS transistor 260 is coupled to the PMOS transistors 240 and 250 in parallel. As shown in FIG. 2B, the drain of the NMOS transistor 260 is coupled to the input-output pad PD_C. The source of the NMOS transistor 260 is coupled to the output terminal OUT_1. The gate of the NMOS transistor 260 receives an input signal IN_4.

In one embodiment, the level of the input signal IN_3 is the opposite of the level of the input signal IN_4. For example, when the input signal IN_3 is at a high level (e.g., 10.6V), the input signal IN_4 is at a low level (e.g., 0V). When the input signal IN_3 is at a low level (e.g., 0V), the input signal IN_4 is at a high level (e.g., 10.6V). In other embodiments, the input signal IN_3 may be the same as the input signal IN_2, and the input signal IN_4 may be the same as the input signal IN_1.

In this embodiment, the bulk 241 of the PMOS transistor 240 is electrically isolated from the bulk 251 of the PMOS transistor 250. In one embodiment, the voltages of the bulks 241 and 251 are floating levels, but the disclosure is not limited thereto. In other embodiments, the bulk 241 may be coupled to the input-output pad PD_C. In some embodiments, the bulks 211, 221, 241, and 250 are electrically isolated from each other.

Since the characteristics of the PMOS transistors 240 and 250 are similar to the characteristics of the PMOS transistors 210 and 220, the related description is omitted here. Additionally, Since the characteristic of the NMOS transistor 260 is similar to the characteristic of the NMOS transistor 230, the related description is omitted here. In this embodiment, the PMOS transistors 210 and 220, and the NMOS transistor 230 constitute a first pass-gate, and the PMOS transistors 240 and 250, and the NMOS transistor 260 constitute a second pass-gate.

In one embodiment, when the first pass-gate is turned on, the second pass-gate is turned off. Therefore, the PMOS transistors 210 and 220, and the NMOS transistor 230 transmit the signal or voltage of the input-output pad PD_A to the output terminal OUT_1. When the second pass-gate is turned on, the first pass-gate is turned off. Therefore, the PMOS transistors 240 and 250, and the NMOS transistor 260 transmit the signal or voltage of the input-output pad PD_C to the output terminal OUT_1.

In some embodiments, when the second pass-gate is turned on, the voltage of the output terminal OUT_1 is equal to the voltage (e.g., 10.6V) of the input-output pad PD_C. At this time, the voltage of the bulk 221 of the PMOS transistor 220 may be approximately equal to 9.8V, which is the voltage (e.g., 10.6V) of the output terminal OUT_1 minus the voltage (0.8V) of the PN junction between the drain and the bulk 221 of the PMOS transistor 220. The source voltage of the PMOS transistor 220 is approximately equal to 1.6V, which is the voltage (9.8V) of the bulk 221 minus the breakdown voltage (8.2V) between the bulk 221 and the source of the PMOS transistor 220. Since the gate voltage (e.g., 10.6V) of the PMOS transistor 220 is higher than the source voltage of the PMOS transistor 220, the PMOS transistor 220 is maintained to be turned off. Therefore, the PMOS transistors 210 and 220 do not be interfered by the high level of the output terminal OUT_1.

Figure 3:
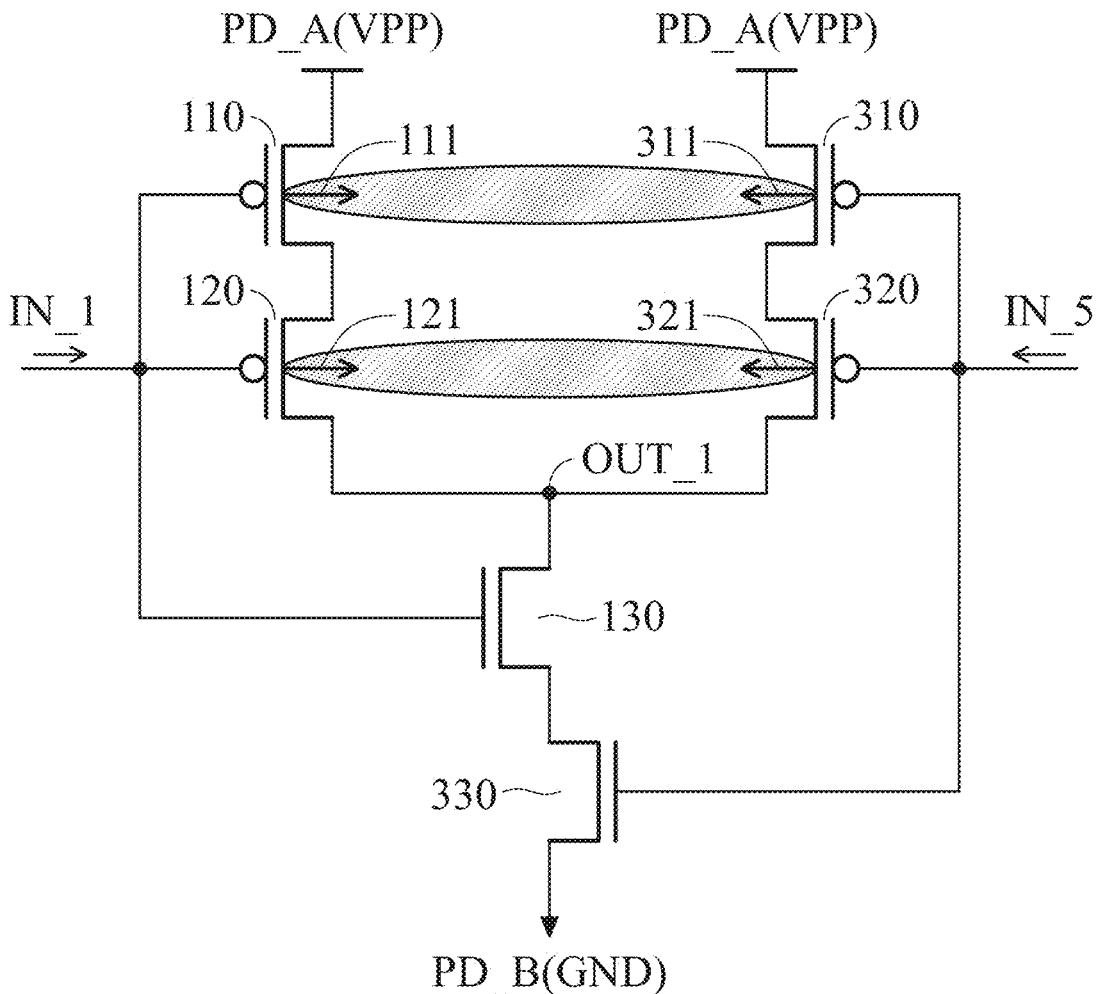
FIG. 3 is a schematic diagram of another exemplary embodiment of the logic circuit according to various aspects of the present disclosure.

FIG. 3 is a schematic diagram of another exemplary embodiment of the logic circuit according to various aspects of the present disclosure. FIG. 3 is similar to FIG. 1 exception that the logic circuit 100B further comprises PMOS transistors 310 and 320, and an NMOS transistor 330. The PMOS transistor 110 is connected to the PMOS transistor 120 in series between the input-output pad PD_A and the output terminal OUT_1. The PMOS transistors 110 and 120 serve as a first transmission path.

The PMOS transistor 310 is connected to the PMOS transistor 320 in series between the input-output pad PD_A and the output terminal OUT_1. The PMOS transistors 310 and 320 serve as a second transmission path. The second transmission path is parallel with the first transmission path. In this embodiment, the source of the PMOS transistor 310 is coupled to the input-output pad PD_A, and the gate of the PMOS transistor 310 receives an input signal IN_5. The source of the PMOS transistor 320 is coupled to the drain of the PMOS transistor 310. The gate of the PMOS transistor 320 and the gate of the NMOS transistor 330 receive the input signal IN_5. The drain of the PMOS transistor 320 is coupled to the output terminal OUT_1.

The NMOS transistor 130 is connected to the NMOS transistor 330 in series between the output terminal OUT_1 and the input-output pad PD_B. In this embodiment, the drain of the NMOS transistor 130 is coupled to the output terminal OUT_1 and the gate of the NMOS transistor 130 receives the input signal IN_1. The drain of the NMOS transistor 330 is coupled to the source of the NMOS transistor 130. The source of the NMOS transistor 330 is coupled to the input-output pad PD_B.

In this embodiment, the bulk 311 of the PMOS transistor 310 is electrically isolated from the bulk 321 of the PMOS transistor 320. In one embodiment, the voltage levels of the bulks 311 and 321 are floating levels, but the disclosure is not limited thereto. In one embodiment, the bulk 311 is coupled to the input-output pad PD_A. In this case, the voltage level of the bulk 311 is equal to the operating voltage VPP. In some embodiments, the voltage levels of the bulks 111, 121, 311, and 321 are floating levels.

In other embodiments, the bulk 111 is electrically connected to the bulk 311, and the bulk 121 is electrically connected to the bulk 321. In this embodiment, the bulk 111 is electrically isolated from the bulk 121. In one embodiment, the bulks 111 and 311 may be coupled to the input-output pad PD_A. In another embodiment, the bulk 111 is coupled to the bulk 311. In this case, the voltage levels of the bulks 111 and 311 are the same, such as a floating level. In some embodiments, the bulk 111 is electrically connected to the bulk 311 and isolated from the bulk 121. In this case, the voltage level of the bulk 121 may be a first floating level, and the voltage level of the bulk 321 is a second floating level.

The PMOS transistors 110 and 120 work according to the input signal IN_1, and the PMOS transistors 310 and 320 work according to the input signal IN_5. Since the characteristics of the PMOS transistors 110 and 120 are similar to the characteristics of the PMOS transistors 310 and 320, the PMOS transistors 310 and 320 are given as an example. Additionally, assume that the bulk 111 is electrically connected to the bulk 311 and the voltage level of each of the bulks 111 and 311 is a first floating level. For brevity, assume that the bulk 121 is electrically connected to the bulk 321 and the voltage level of each of the bulks 121 and 321 is a second floating level. Furthermore, assume that the operating voltage VPP is equal to 10.6V, the voltage of the PN junction between the source and the bulk of a PMOS transistor is about 0.8V, and the breakdown voltage between the bulk and the drain of the PMOS transistor is about 8.2V.

When the input signal IN_5 is at a high level (e.g., 10.6V), since the gate voltage of the PMOS transistor 310 is equal to the source voltage of the PMOS transistor 310, the PMOS transistor 310 is turned off. At this time, the voltage of the bulk 311 is approximately equal to 9.8V, which is the operating voltage VPP (10.6V) minus the voltage (0.8V) of the PN junction between the source and the bulk 311 of the PMOS transistor 310. The source voltage of the PMOS transistor 320 is approximately equal to the voltage (9.8V) of the bulk 311 minus the breakdown voltage (8.2V) between the bulk 311 and the drain of the PMOS transistor 310. Since the source voltage (1.6V) of the PMOS transistor 320 is lower than the gate voltage (10.6V) of the PMOS transistor 320, it is ensured that the PMOS transistor 320 is turned off. Furthermore, the voltage of the bulk 321 is equal to the source voltage (1.6V) of the PMOS transistor 320 minus the voltage of the PN junction between the source and the bulk 321 of the PMOS transistor 320. Since the voltage of the bulk 321 is about 0.8V, which is not enough to cause a breakdown event between the bulk 321 and drain of the PMOS transistor 320, the leakage current can be avoided.

When the input signal IN_5 is at a low level (e.g., 0V), since the gate voltage of the PMOS transistor 310 is lower than the source voltage of the PMOS transistor 310, the PMOS transistor 310 is turned on. At this time, the voltage (9.8V) of the bulk 311 is approximately equal to the operating voltage VPP (10.6V) minus the voltage (0.8V) of the PN junction between the source and the bulk 311 of the PMOS transistor 310. Since the PMOS transistor 310 is turned on, the source voltage of the PMOS transistor 320 is approximately equal to the operating voltage VPP (10.6V). At this time, the voltage (9.8V) of the bulk 321 is approximately equal to the source voltage (10.6V) of the PMOS transistor 320 minus the voltage (0.8V) of the PN junction between the source and the bulk 321 of the PMOS transistor 320. Since the PMOS transistor 320 is turned on, the voltage of the output terminal OUT_1 is approximately equal to the operating voltage VPP (e.g., 10.6V).

In this embodiment, the logic circuit 100B serves as a NAND gate. For example, when each of the input signals IN_1 and IN_5 is at a high level, the PMOS transistors 110, 120, 310, and 320 are turned off, and the NMOS transistors 130 and 330 are turned on. Therefore, the voltage of the output terminal OUT_1 is approximately equal to the voltage of the input-output pad PD_B, such as the operating voltage GND. When each of the input signals IN_1 and IN_5 is at a low level, the PMOS transistors 110, 120, 310, and 320 are turned on, and the NMOS transistors 130 and 330 are turned off. Therefore, the voltage of the output terminal OUT_1 is approximately equal to the voltage of the input-output pad PD_A, such as the operating voltage VPP.

In other embodiments, when the input signal IN_1 is at a low level and the input signal IN_5 is at a high level, the PMOS transistors 110 and 120 are turned on. Therefore, the voltage of the output terminal OUT_1 is approximately equal to the voltage of the input-output pad PD_A. At this time, the NMOS transistor 330 is turned on and the PMOS transistors 310 and 320, and the NMOS transistor 130 are turned off. In another embodiment, when the input signal IN_1 is at a high level and the input signal IN_5 is at a low level, the PMOS transistors 310 and 320 are turned on. Therefore, the voltage of the output terminal OUT_1 is approximately equal to the voltage of the input-output pad PD_A. At this time, the NMOS transistor 130 is turned on and the PMOS transistors 110 and 120, and the NMOS transistor 330 are turned off.

Figure 4:
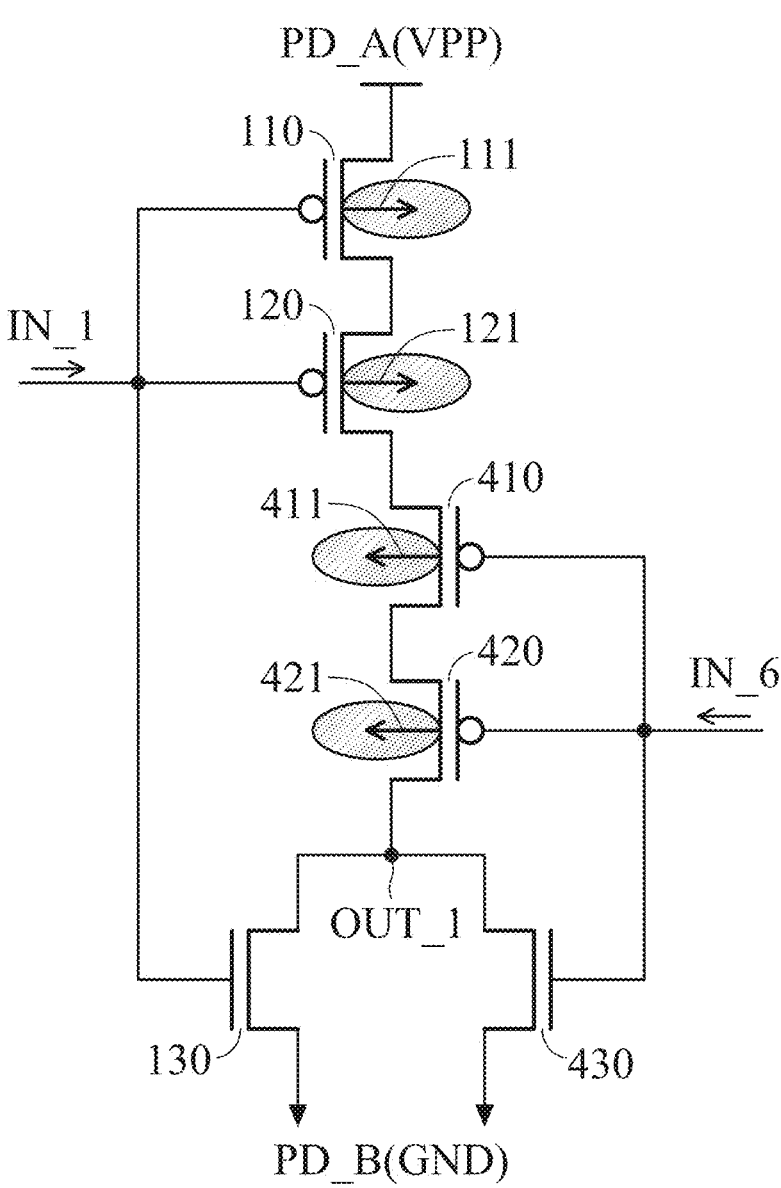
FIG. 4 is a schematic diagram of another exemplary embodiment of the logic circuit according to various aspects of the present disclosure.

FIG. 4 is a schematic diagram of another exemplary embodiment of the logic circuit according to various aspects of the present disclosure. FIG. 4 is similar to FIG. 1 except that the logic circuit 100C further comprises PMOS transistors 410 and 420, and an NMOS transistor 430. In this embodiment, the PMOS transistors 110, 120, 410, and 420 are connected to each other in series between the input-output pad PD_A and the output terminal OUT_1. The source of the PMOS transistor 410 is coupled to the drain of the PMOS transistor 120. The gates of the PMOS transistors 410 and 420 receive the input signal IN_6. The source of the PMOS transistor 420 is coupled to the drain of the PMOS transistor 410. The drain of the PMOS transistor 420 is coupled to the output terminal OUT_1.

In one embodiment, the bulks 111, 121, 411, and 421 are electrically isolated from each other. In another embodiment, the voltage levels of the bulks 111, 121, 411, and 421 are floating levels. In some embodiments, the bulk 111 may be coupled to the input-output pad PD_A. In this case, the bulk 121 may be coupled to the source of the PMOS transistor 120.

The NMOS transistors 130 and 430 are coupled between the output terminal OUT_1 and the input-output pad PD_B in parallel. The drains of the NMOS transistors 130 and 430 are coupled to the output terminal OUT_1. The gate of the NMOS transistor 130 receives the input signal IN_1. The gate of the NMOS transistor 430 receives the input signal IN_6. The sources of the NMOS transistors 130 and 430 are coupled to the input-output pad PD_B.

When the input signal IN_1 is at a low level (e.g., 0V) and the input signal IN_6 is at a high level (e.g., 10.6V), the PMOS transistors 110 and 120 are turned on and the PMOS transistors 410 and 420 are turned off. At this time, since the NMOS transistor 430 is turned on, the voltage of the output terminal OUT_1 is equal to the voltage of the input-output pad PD_B. In one embodiment, the voltage of the bulk 111 is approximately equal to 9.8V, which is the operating voltage VPP (10.6V) minus the voltage (0.8V) of the PN junction between the source and the bulk 111 of the PMOS transistor 110. Since the PMOS transistor 110 is turned on, the source voltage of the PMOS transistor 120 is approximately equal to the operating voltage VPP (e.g., 10.6V). The voltage of the bulk 121 is approximately equal to 9.8V, which is the source voltage of the PMOS transistor 120 minus the voltage (0.8V) of the PN junction between the source and the bulk 121 of the PMOS transistor 120. Since the PMOS transistor 120 is turned on, the source voltage of the PMOS transistor 410 is approximately equal to the operating voltage VPP (10.6V). The voltage of the bulk 411 is approximately equal to 9.8V, which is the operating voltage VPP (10.6V) minus the voltage (0.8V) of the PN junction between the source and the bulk 411 of the PMOS transistor 410. The source voltage of the PMOS transistor 420 is approximately equal to 1.6V, which is the voltage (9.8V) of the bulk 411 minus the breakdown voltage (8.2V)

between the bulk and the drain of the PMOS transistor 410. Since the source voltage (1.6V) of the PMOS transistor 420 is lower than the gate voltage (10.6V) of the PMOS transistor 420, it is ensured that the PMOS transistor 420 is turned off. At this time, the voltage of the bulk 420 is approximately equal to 0.8V, which is the source voltage (1.6V) of the PMOS transistor 420 minus the voltage (0.8V) of the PN junction between the source and the bulk 421 of the PMOS transistor 420. Since the voltage of the bulk 421 is not enough to cause the breakdown event in the PMOS transistor 420, no leakage current will occur.

When the input signal IN_1 is at a high level (e.g., 10.6V) and the input signal IN_6 is at a low level (e.g., 0V), the PMOS transistors 110 and 120, and the NMOS transistor 430 are turned off and the PMOS transistors 410 and 420 are turned on. At this time, since the NMOS transistor 130 is turned on, the voltage of the output terminal OUT_1 is approximately equal to the voltage (e.g., 0V) of the input-output pad PD_B. In this case, the voltage of the bulk 111 is approximately equal to 9.8V, which is the operating voltage VPP (10.6V) minus the voltage (0.8V) of the PN junction of the PMOS transistor 110. Since the voltage of the bulk 111 is higher than the breakdown voltage (8.2V) between the bulk and the source of the PMOS transistor 110, the source voltage of the PMOS transistor 120 is approximately equal to 1.6V. At this time, the voltage of the bulk 121 is approximately equal to 0.8V, which is the source voltage (1.6V) of the PMOS transistor 120 minus the voltage (0.8V) of the PN junction between the source and the bulk of the PMOS transistor 120. Since the PMOS transistor 120 is turned off, the PMOS transistor 120 stops transmitting voltage so that the source voltage of the PMOS transistor 410 is approximately equal to 0V. At this time, the voltages of the bulks 411 and 421 are approximately equal to 0V.

When each of the input signals IN_1 and IN_6 is at a low level (e.g., 0V), the PMOS transistors 110, 120, 410, and 420 are turned on and the NMOS transistors 130 and 430 are turned off. Therefore, the voltage of the output terminal OUT_1 is approximately equal to the operating voltage VPP of the input-output pad PD_A. In this case, the source voltages of the PMOS transistors 110, 120, 410, and 420 are approximately equal to the operating voltage VPP. The voltages of the bulks 111, 121, 411, and 420 are approximately equal to 9.8V, which is a corresponding source voltage (10.6V) minus the voltage (0.8V) of a corresponding PN junction.

When each of the input signals IN_1 and IN_6 is at a high level (e.g., 10.6V), the PMOS transistors 110, 120, 410, and 420 are turned off and the NMOS transistors 130 and 430 are turned on. Therefore, the voltage of the output terminal OUT_1 is approximately equal to the operating voltage GND of the input-output pad PD_B. In this case, the voltage of the bulk 111 is approximately equal to 9.8V, which is the operating voltage VPP (e.g., 10.6V) minus the voltage (0.8V) of the PN junction between the source and the bulk 111 of the PMOS transistor 110. The source voltage of the PMOS transistor 120 is approximately equal to 1.6V, which is the voltage (9.8V) of the bulk 111 minus the breakdown voltage (8.2V) between the bulk 111 and the drain of the PMOS transistor 110. Since the source voltage (1.6V) of the PMOS transistor 120 is lower than the gate voltage (10.6) of the PMOS transistor 120, the PMOS transistor 120 is turned off. Additionally, the voltage of the bulk 121 is approximately equal to 0.8V, which is the source voltage (1.6V) of the PMOS transistor 120 minus the voltage (0.8V) of the PN junction between the source and the bulk 121 of the PMOS transistor 120. Since the voltage (0.8V) of the bulk 121 is lower than the breakdown voltage between the bulk and the drain of the PMOS transistor 120, no leakage current passes through the PMOS transistor 120. At this time, the voltages of the bulks 411 and 420 are approximately equal to 0V.

In this embodiment, the logic circuit 100C serves as an NOR gate. When one of the input signals IN_1 and IN_6 is at a high level, the voltage of the output terminal OUT_1 is approximately equal to the operating voltage GND (0V) of the input-output pad PD_B. When each of the input signals IN_1 and IN_6 is at a low level, the voltage of the output terminal OUT_1 is approximately equal to the operating voltage VPP (10.6V) of the input-output pad PD_A.

Figure 5:
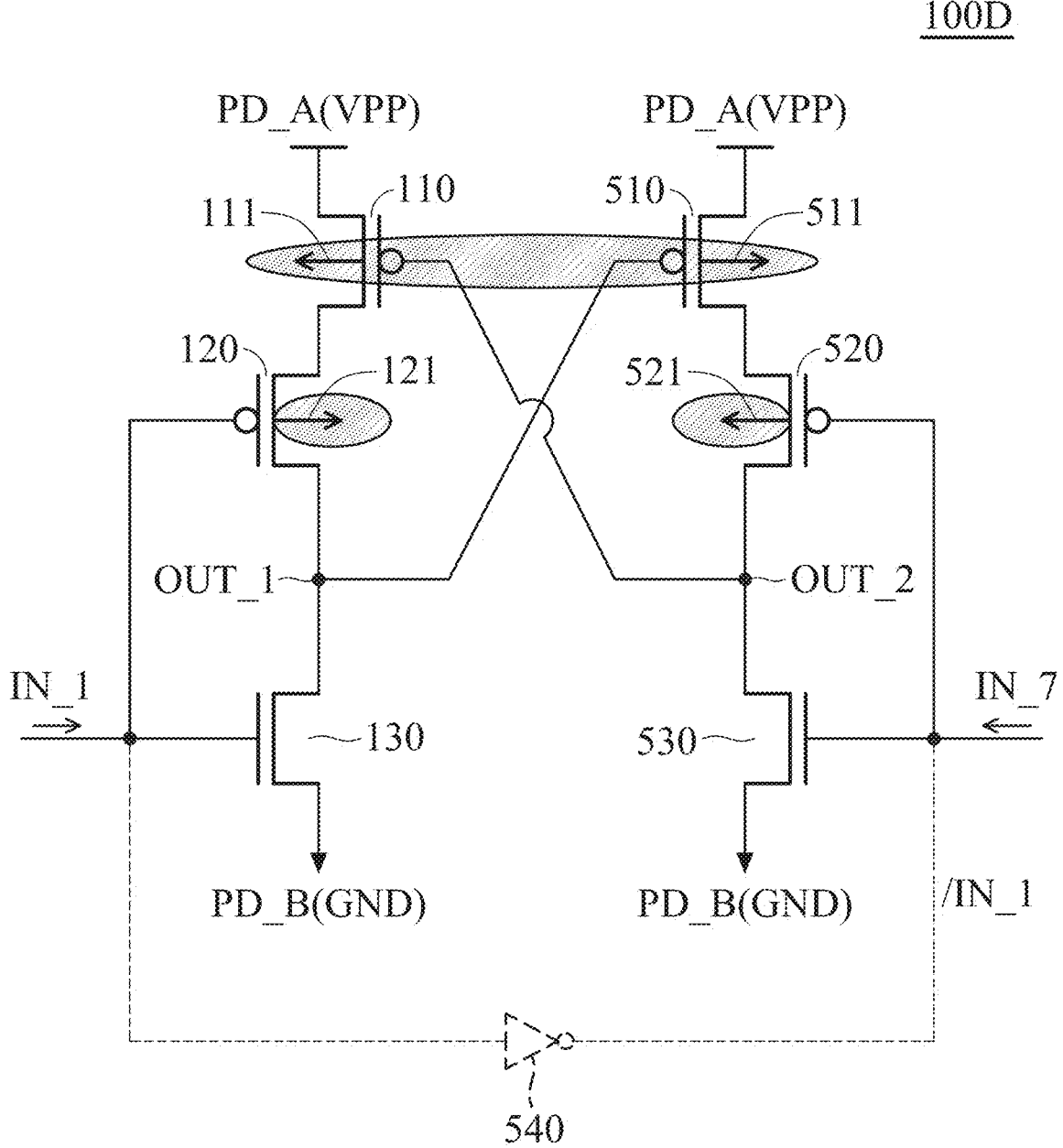
FIG. 5 is a schematic diagram of another exemplary embodiment of the logic circuit according to various aspects of the present disclosure.

FIG. 5 is a schematic diagram of another exemplary embodiment of the logic circuit according to various aspects of the present disclosure. FIG. 5 is similar to FIG. 1 except for the additions of PMOS transistors 510 and 520, and an NMOS transistor 530. Additionally, the gate of the PMOS transistor 110 shown in FIG. 5 is coupled to another output terminal OUT_2. In this embodiment, the PMOS transistors 510 and 520, and the NMOS transistor 530 are connected to each other in series between the input-output pads PD_A and PD_B.

The source of the PMOS transistor 510 is coupled to the input-output pad PD_A and the gate of the PMOS transistor 510 is coupled to the output terminal OUT_1. The source of the PMOS transistor 520 is coupled to the drain of the PMOS transistor 510. The drain of the PMOS transistor 520 is coupled to the gate of the PMOS transistor 110 and the output terminal OUT_2. The gate of the PMOS transistor 520 and the gate of the NMOS transistor 530 receive an input signal IN_7. The drain of the NMOS transistor 530 is coupled to the output terminal OUT_2. The source of the NMOS transistor 530 is coupled to the input-output pad PD_B.

In one embodiment, the PMOS transistor 120 and the NMOS transistor 130 constitute a first inverter circuit, and the PMOS transistor 520 and the NMOS transistor 530 constitute a second inverter circuit. In this case, the level of the output terminal OUT_1 is the opposite of the level of the input signal IN_1, and the level of the output terminal OUT_2 is the opposite of the level of the input signal IN_7.

In this embodiment, the level of the input signal IN_1 is the opposite of the level of the input signal IN_7. In some embodiments, the logic circuit 100D further comprises an inverter 540. The input of the inverter 540 is coupled to the gate of the PMOS transistor 120 and the gate of the NMOS transistor 130. The output of the inverter 540 is coupled to the gate of the PMOS transistor 520 and the gate of the NMOS transistor 530. The inverter 540 inverts the input signal IN_1 to generate an inverted signal IN_1. The inverted signal IN_1 is provided to the gate of the PMOS transistor 520 and the gate of the NMOS transistor 530.

The bulk 111 is electrically connected to the bulk 511. In another embodiment, the bulks 111 and 511 are electrically connected to the input-output pad PD_A. The bulks 121, 511, and 521 are electrically isolated from each other. In one embodiment, the voltage of each of the bulks 111, 121, 511, and 521 is a floating level.

When the input signal IN_1 is at a high level (e.g., 5V), the NMOS transistor 130 is turned on. Therefore, the voltage of the output terminal OUT_1 is approximately equal to the ground voltage (0V) of the input-output pad PD_B so that the PMOS transistor 511 is turned on. Since the input signal IN_7 is the opposite of the input signal IN_1, the input signal IN_7 is at a low level. Therefore, the NMOS transistor 530 is turned off and the PMOS transistor 520 is turned on. Since the PMOS transistors 510 and 520 are turned on, the voltage of the output terminal OUT_2 is approximately equal to the operating voltage VPP (10.6V). At this time, the voltage of the bulk 511 is approximately equal to 9.8V, which is the operating voltage VPP (10.6V) minus the voltage (0.8V) of the PN junction between the source and the bulk 511 of the PMOS transistor 510. Since the PMOS transistor 510 is turned on, the source voltage of the PMOS transistor 520 is approximately equal to the operating voltage VPP. At this time, the voltage of the bulk 521 is approximately equal to 9.8V, which is the source voltage (10.6V) of the PMOS transistor 520 minus the voltage (0.8V) of the PN junction between the source and the bulk 521 of the PMOS transistor 520.

The voltage of the bulk 111 is approximately equal to 9.8V, which is the operating voltage VPP (10.6V) minus the voltage (0.8V) of the PN junction between the source and the bulk 111 of the PMOS transistor 110. Since the voltage (9.8V) of the bulk 111 is higher than the breakdown voltage (8.2V) between the bulk 111 and the drain of the PMOS transistor 110, the source voltage of the PMOS transistor 120 is approximately equal to 1.6V (9.8V-8.2V). Since the source voltage (1.6V) of the PMOS transistor 120 is lower than the gate voltage (5V) of the PMOS transistor 120, the PMOS transistor 120 is turned off. Additionally, the voltage of the bulk 121 is approximately equal to 0.8V, which is the source voltage (1.6V) of the PMOS transistor 120 minus the voltage (0.8V) of the PN junction between the source and the bulk 121 of the PMOS transistor 120. Since the voltage (0.8V) of the bulk 121 is lower than the breakdown voltage (8.2V) between the bulk 121 and the drain of the PMOS transistor 120, no leakage current will be generated due to the breakdown event of the PMOS transistor.

In this embodiment, the logic circuit 100D serves as a level shifter. When the input signal IN_1 is at a first high level (e.g., 5V), the voltage of the output terminal OUT_2 is a second high level (e.g., 10.6V). In this case, when the input signal IN_1 is at a first low level, the voltage of the output terminal OUT_2 may be a second low level. The second low level may be equal to the first low level, or lower than the first low level.

When the voltage of an input-output pad is higher than the breakdown voltage of a PMOS transistor, the breakdown event may occur in the PMOS transistor to generate a leakage current. However, if no voltage is provided to the bulk of the PMOS transistor, the voltage of the bulk of the PMOS transistor is a floating level to avoid the level of the bulk of the PMOS transistor being too large. When the voltage of the bulk of the PMOS transistor is lower than the breakdown voltage of the PMOS transistor, no leakage current occurs in the PMOS transistor. Since the voltage of the input-output pad is not limited by the breakdown voltage of the PMOS transistor, the design flexibility of the logic circuit can be greatly improved. Furthermore, no additional components or special process conditions are required to ensure that no breakdown event occurs in the PMOS transistor.

It will be understood that when an element is referred to as being "coupled to" another element, it can be directly coupled to the other element or intervening elements may be present. In contrast, when an element is referred to as be "connected to" another element, there are no intervening elements or layers present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another. In the following claims, the terms "first," "second," etc. are used merely as labels, and are not intended to impose numerical requirements on their objects.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A logic circuit, comprising:
   a first PMOS transistor coupled to a first input-output pad;
   a second PMOS transistor coupled to the first PMOS transistor in series between the first input-output pad and a first output terminal and receiving a first input signal; and
   a first NMOS transistor coupled to the second PMOS transistor,
   wherein:
   a voltage of a bulk of the first PMOS transistor is a first floating level, and a voltage of a bulk of the second PMOS transistor is a second floating level,
   the first input-output pad receives an operating voltage which is higher than the voltage of the bulk of the first PMOS transistor and the voltage of the bulk of the second PMOS transistor,
   the first NMOS transistor is coupled between the first input-output pad and the first output terminal and receives a second input signal, and
   a level of the first input signal is the opposite of a level of the second input signal.

2. The logic circuit as claimed in claim 1, further comprising:
   a third PMOS transistor coupled to a second input-output pad;
   a fourth PMOS transistor coupled to the third PMOS transistor in series between the second input-output pad and the first output terminal and receiving a third input signal;
   a second NMOS transistor coupled between the second input-output pad and the first output terminal and receiving a fourth input signal,
   wherein a level of the third input signal is the opposite of a level of the fourth input signal.

3. The logic circuit as claimed in claim 2, wherein:
   in response to the first input signal turning on the first and second PMOS transistors, the second input signal turns on the first NMOS transistor so that a voltage of the first output terminal is equal to a voltage of the first input-output pad,
   in response to the third input signal turning on the third and fourth PMOS transistors, the fourth input signal turns on the second NMOS transistor so that the voltage of the first output terminal is equal to a voltage of the second input-output pad.

4. A logic circuit, comprising: a first PMOS transistor coupled to a first input-output pad; a second PMOS transistor coupled to the first PMOS transistor in series between the first input-output pad and a first output terminal and receiving a first input signal; and a first NMOS transistor coupled to the second PMOS transistor; a third PMOS transistor receiving a second input signal; a fourth PMOS transistor coupled to the third PMOS transistor in series between the first input-output pad and the first output terminal and receiving the second input signal; and a second NMOS transistor coupled to the first NMOS transistor and receiving the second input signal, wherein: a voltage of a bulk of the first PMOS transistor is a first floating level, and a voltage of a bulk of the second PMOS transistor is a second floating level, the first NMOS transistor is coupled between the first output terminal and a third input-output pad and receives the first input signal, in response to the first and second PMOS transistor being turned on, the first NMOS transistor is turned off, and in response to the first NMOS transistor being turned on, the first and second PMOS transistors are turned off.

5. The logic circuit as claimed in claim 4, wherein: the first PMOS transistor is connected to the second PMOS transistor in series between the first input-output pad and the first output terminal, and the first PMOS transistor and the second PMOS transistor serve as a first transmission path, the third PMOS transistor is connected to the fourth-PMOS transistor in series between the first input-output pad and the first output terminal, and the third PMOS transistor and the fourth PMOS transistor serve as a second transmission path, the first transmission path is parallel with the second transmission path, the first NMOS transistor is connected to the third NMOS transistor in series between the first output terminal and the third input-output pad, the bulk of the first PMOS transistor is electrically connected to a bulk of the third PMOS transistor, and the bulk of the second PMOS transistor is electrically connected to a bulk of the fourth PMOS transistor.

6. The logic circuit as claimed in claim 4, wherein: the first, second, third, and fourth PMOS transistors are connected to each other in series between the first input-output pad and the first output terminal, the first and third NMOS transistors are connected in parallel between the first output terminal and the third input-output pad, the bulks of the first, second, third, and fourth PMOS transistors are electrically isolated from each other.

7. A logic circuit, comprising: a first PMOS transistor coupled to a first input-output pad; a second PMOS transistor coupled to the first PMOS transistor in series between the first input-output pad and a first output terminal and receiving a first input signal; and a first NMOS transistor coupled to the second PMOS transistor; a third PMOS transistor coupled to the first input-output pad; an fourth PMOS transistor coupled to the third PMOS transistor in series between the first input-output pad and a second output terminal; and a second NMOS transistor coupled between the second output terminal and the third input-output pad, wherein: a voltage of a bulk of the first PMOS transistor is a first floating level, and a voltage of a bulk of the second PMOS transistor is a second floating level, the first NMOS transistor is coupled between the first output terminal and a third input-output pad and receives the first input signal, a gate of the first PMOS transistor is coupled to the second output terminal, a gate of the third PMOS transistor is coupled to the first output terminal, a gate of the fourth PMOS transistor is coupled to a gate of the second NMOS transistor and receives a second input signal.

8. The logic circuit as claimed in claim 7, wherein a level of the first input signal is the opposite of a level of the second input signal.

9. The logic circuit as claimed in claim 8, further comprising: an inverter inverting the level of the first input signal to generate an inverted signal and providing the inverted signal to the gate of the second NMOS transistor.

10. The logic circuit as claimed in claim 9, wherein a level of a bulk of the third PMOS transistor is a third floating level, and a level of a bulk of the fourth PMOS transistor is a third floating level.

11. The logic circuit as claimed in claim 10, wherein the bulk of the first PMOS transistor is electrically connected to the bulk of the third PMOS transistor.

12. The logic circuit as claimed in claim 7, wherein the voltages of the bulks of the first and third PMOS transistors are lower than the voltage of the first input-output pad.

13. The logic circuit as claimed in claim 12, wherein the voltage of the first output terminal is higher than the voltage of the first input signal.

14. The logic circuit as claimed in claim 13, wherein in response to the first NMOS transistor being turned on, the second NMOS transistor and the first and second PMOS transistors are turned off and the seventh and fourth PMOS transistors are turned on.

15. The logic circuit as claimed in claim 14, wherein in response to the first NMOS transistor being turned on, the voltage of the second output terminal is equal to the voltage of the first input-output pad.

16. The logic circuit as claimed in claim 7, wherein: the second PMOS transistor and the first NMOS transistor constitute a first inverter circuit, the level of the first output terminal is the opposite of the level of the first input signal, the fourth PMOS transistor and the second NMOS transistor constitute a second inverter circuit, the level of the second output terminal is the opposite of the level of the sixth input signal.

* * * * *